United States Patent
Kwon

(10) Patent No.: US 8,647,703 B2
(45) Date of Patent: Feb. 11, 2014

(54) APPARATUS AND METHOD FOR COATING PHOTORESIST

(75) Inventor: O Jun Kwon, Gyeongsan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/169,218

(22) Filed: Jun. 28, 2005

(65) Prior Publication Data

US 2006/0045972 A1    Mar. 2, 2006

(30) Foreign Application Priority Data

Aug. 31, 2004   (KR) .................. 10-2004-0069360

(51) Int. Cl.
*B05D 1/00*   (2006.01)
*B05D 1/26*   (2006.01)

(52) U.S. Cl.
USPC ............... 427/8; 427/358; 118/410; 118/670; 118/712

(58) Field of Classification Search
USPC ..................................... 427/358, 8
See application file for complete search history.

(56) References Cited

U.S. PATENT DOCUMENTS

| | | | |
|---|---|---|---|
| 6,139,639 A | * | 10/2000 | Kitamura et al. ............. 118/680 |
| 6,287,636 B1 | * | 9/2001 | Kokubo et al. ............... 427/356 |
| 2004/0173148 A1 | * | 9/2004 | Kim et al. ...................... 118/670 |

FOREIGN PATENT DOCUMENTS

| | | | |
|---|---|---|---|
| JP | 10-318934 | * | 12/1998 |
| JP | 2000-024571 | * | 1/2000 |
| JP | 2002001195 A | | 1/2002 |

OTHER PUBLICATIONS

Definition of "barrier", Answers.com, www.answers.com/topic/barrier, p. 1, Feb. 10, 2011.*

* cited by examiner

*Primary Examiner* — Katherine A Bareford
(74) *Attorney, Agent, or Firm* — Brinks Gilson & Lione

(57) ABSTRACT

Provided is an apparatus for coating a photoresist on a substrate. The photoresist coating apparatus includes a nozzle, a discharge unit, and a foreign substance barrier. The nozzle coats a photoresist on the substrate. The discharge unit is formed in a body with a lower portion of the nozzle and discharges a photoresist. The foreign substance barrier is formed at a front lower portion of the nozzle and protects the discharge unit from a foreign substance on the substrate.

9 Claims, 4 Drawing Sheets

# APPARATUS AND METHOD FOR COATING PHOTORESIST

This application claims the benefit of Korean patent application No.: 2004-69360, filed on Aug. 31, 2004, which is incorporated herein by reference.

TECHNICAL FIELD

The present application relates to a liquid crystal display, and more particularly, to an apparatus and method for coating a photoresist on a substrate.

BACKGROUND

A liquid crystal display (LCD) includes a liquid crystal panel, and the liquid crystal panel includes lower and upper substrates facing each other with a liquid crystal layer therebetween. The liquid crystal layer has optical anisotropy and polarizability.

Electric field generating electrodes are formed respectively on facing surfaces of the lower and upper substrates. The alignment direction of liquid crystal molecules changes according to a voltage difference between the electric field generating electrodes, and various images are displayed through a change in a light transmittance due to the change in the alignment direction.

An active matrix mode liquid crystal display that independently controls a plurality of pixels defined in a liquid crystal panel by using switching devices is being widely used. A liquid crystal display using a thin film transistor (TFT) as the switching device is the well-known TFT-LCD.

A manufacturing procedure for the LCD can be separated into a substrate fabricating process, a cell fabricating process, and a module process.

The substrate fabricating process is subdivided into a TFT fabricating process and a color filter fabricating process using a cleaned glass substrate.

The TFT fabrication process forms a plurality of TFTs and pixel electrodes on a lower substrate. The color filter fabricating process forms a common electrode on an upper substrate (on which a black matrix is formed) by forming an R/G/B color filter layer on the upper substrate by using a colorant.

The cell process is a process of fabricating a LCD cell by dispersing spacers between the above lower and upper substrates, assembling the substrates, and then injecting liquid crystal between the assembled substrates.

The module process is a process of fabricating a module by fabricating a signal processing circuit and then connecting a TFT-LCD panel to the signal processing circuit.

In the substrate fabricating process, individual processes such as photolithography, etching, and cleaning are performed to pattern a thin film deposited on a substrate. The individual processes may require a plurality of task repetitions.

The processes are performed such that the thin film is etched after patterning a photoresist on a substrate on which the thin film is deposited, and then the thin film is patterned by removing the photoresist.

Specifically, the photoresist pattering process is a basic process of accurately pattering the thin film, in the LCD manufacturing process.

The photoresist pattering process is performed such that the photoresist is coated on a substrate, the coated photoresist is aligned with respect to a mask and exposed to an ultraviolet (UV) light source. The exposed photoresist and the non-exposed photoresist are differently developed.

At this time, an example of a device for coating the photoresist on the substrate is a photoresist nozzle used in a spin coating method. A photoresist nozzle is fixed over a substrate and dispenses a photoresist on the substrate, and the dispensed photoresist is coated on the whole upper surface of the substrate by the rapid rotation of the substrate.

However, the spin coating method has the following drawbacks.

First, with an increase in the size of an LCD, it becomes more difficult to rapidly rotate a substrate.

Second, the spin coating method causes the upper center and edge portions of the substrate to be more thickly coated with a photoresist than the other upper portions of the substrate, thereby resulting in a non-uniform coating of the substrate.

With an increase in the size of the substrate, a problem of the non-uniform coating becomes more serious.

SUMMARY

An apparatus and method for coating a photoresist on a substrate is described, which can uniformly coat a photoresist on a substrate by using a slit-type photoresist nozzle and effectively prevent the damage of the nozzle or the substrate by removing a foreign substance existing on the substrate during the coating process.

The apparatus includes: a nozzle for coating a photoresist on the substrate; a discharge unit formed in a body with a lower portion of the nozzle so as to discharge a photoresist; and a foreign substance barrier formed at a front lower portion of the nozzle so as to protect the discharge unit from a foreign substance on the substrate.

In another aspect, there is provided a method for coating a photoresist on a substrate, the method including: coating a photoresist on the substrate at a discharge unit of a nozzle while the nozzle is moved from one end portion of the substrate to the other end portion thereof; and determining whether or not a foreign substance exists on the substrate at a foreign substance barrier positioned at a front lower portion of the nozzle.

DETAILED DESCRIPTION

Figure 5:
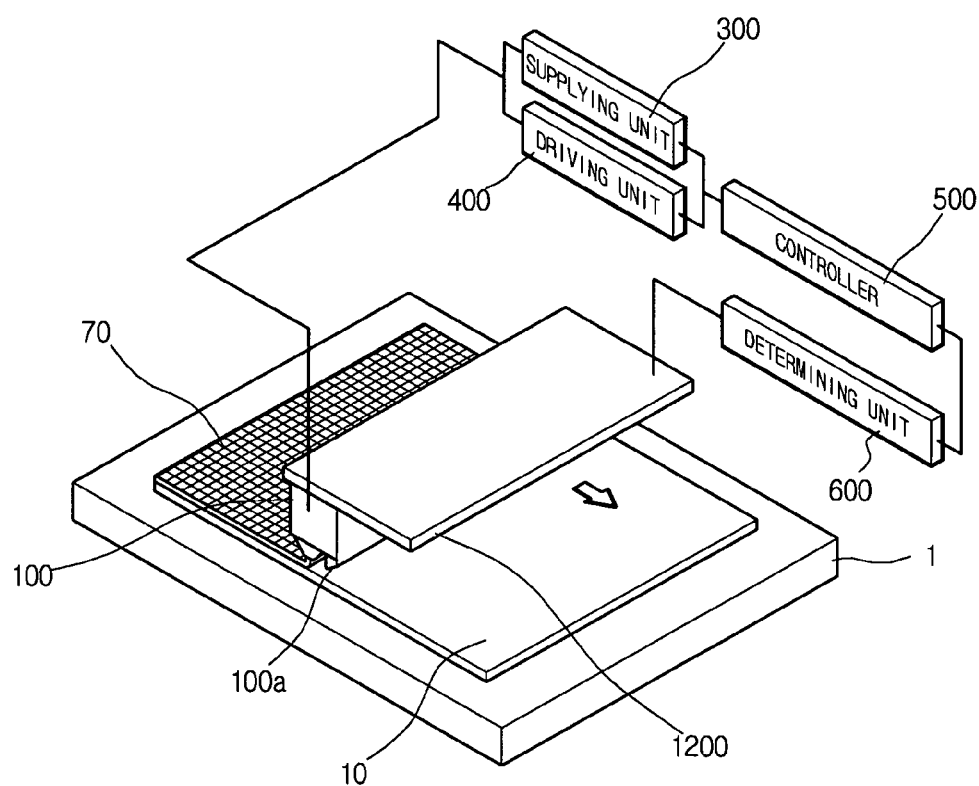
FIG. 5 is a perspective view of a photoresist coating apparatus according to a third embodiment.
Figure 6:
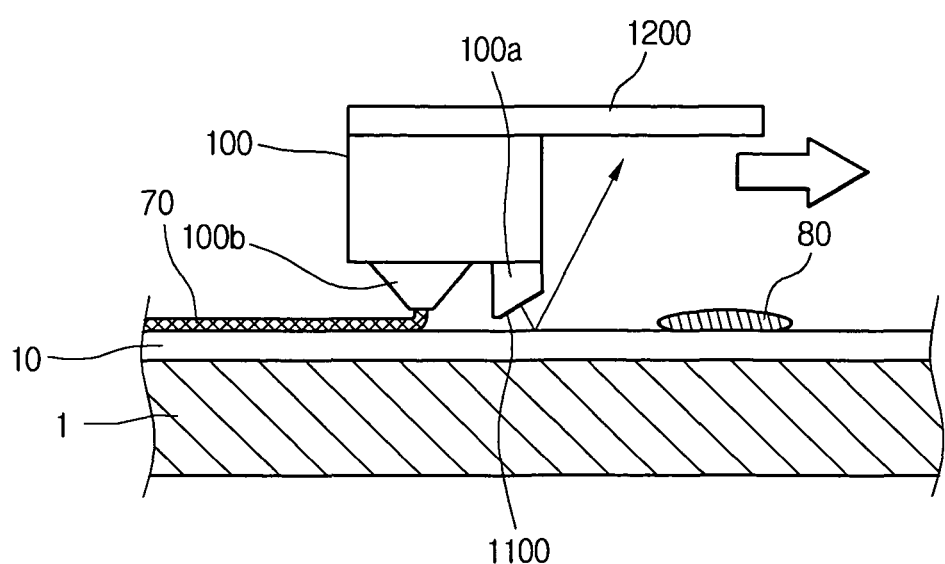
FIG. 6 is a sectional view of the photoresist coating apparatus shown in FIG. 5.

FIG. 6 is a sectional view of the photoresist coating apparatus shown in FIG. 5.

Exemplary embodiments may be better understood with reference to the drawings, but these examples are not intended to be of a limiting nature. Like numbered elements in the same or different drawings perform equivalent functions.

FIGS. 1 to 4 illustrate a first embodiment of a photoresist coating apparatus includes a nozzle 100 for coating a photoresist on a substrate 10, a discharge unit 100B formed integrally with a lower portion of the nozzle 100, and a foreign substance barrier 100A formed at a front lower portion of the nozzle 100.

The nozzle 100 is configured to be a slit arranged across the substrate 10.

The nozzle 100 has a length equal to or larger than the width of the substrate 10. Also, the nozzle 100 discharges a photoresist while moving from one end portion of the substrate 10 to the other end portion.

The discharge unit 100B is formed integrally with the lower portion of the nozzle 100 and discharges a photoresist.

When a foreign substance 80 is present on the substrate 10 when the nozzle 100 moves forward, the foreign substance barrier 100A removes the foreign substance 80 so as to protect the nozzle 100 from the foreign substance 80.

Accordingly, when a foreign substance 80 exists beneath the substrate 10, the nozzle 100 is stopped by the contact of the foreign substance barrier 100A with the substrate 10. Accordingly, the nozzle 100 can be prevented from being damaged.

Although not shown, the photoresist coating apparatus further includes a photoresist supplying unit for storing a photoresist and supplying the photoresist to the nozzle 100, and a transfer driving unit for moving the nozzle 100.

The substrate 10 is a substrate for a LCD, which is to be coated by the photoresist coating apparatus, and may be a transparent insulating substrate such as a glass.

The discharge unit 100B and the foreign substance barrier 100A are disposed above the upper surface of the substrate 10, and transverse to a direction of motion of either the discharge unit 100B or the substrate 10. The length of the discharge unit 100B and the foreign substance barrier 80 is preferably identical to or larger than the width of the substrate 10.

Also, the nozzle 100 moves from one end portion of the substrate 10 to the other end portion, and the foreign substance barrier 100A is positioned at the front in the moving direction of the nozzle 100 and moves together with nozzle 100.

Accordingly, the foreign substance barrier 100A first determines whether or not a foreign substance 80 exists on the substrate 10 and thereby protects the nozzle 100 from the foreign substance 80.

That is, when a foreign substance 80 exists on the substrate 10, the foreign substance barrier 100A removes the foreign substance 80 and the discharge unit 100B discharges a photoresist.

When a foreign substance 80 exists beneath the substrate 10, the nozzle 100 is stopped by the contact of the foreign substance barrier 100A with the substrate 10 because the portion of the substrate 10 disposed above the e foreign substance 80 becomes upwardly convex. Accordingly, the discharge unit 100B of the nozzle 100 can be prevented from being damaged.

The photoresist coating apparatus is characterized in that it further includes the foreign substance barrier 100A for protecting the discharge unit 100B of the nozzle 100 from the foreign substance 80 on the substrate 10 by removing the foreign substance 80 before the discharge unit 100B reaches the foreign substance 80.

When a foreign substance 80 exists on the substrate 10, the discharge unit 100B discharges a photoresist after the foreign substance barrier 100A first removes the foreign substance 80.

The photoresist coating apparatus further includes the foreign substance barrier 100A that has a length corresponding to the width of the substrate 10, is arranged across the upper surface of the substrate 10, and protects the discharge unit 100B by removing the foreign substance 80 on the substrate 10.

The nozzle 100 discharges a photoresist on the substrate 10 while moving from one end portion of the substrate 10 to the other end portion, and the foreign substance barrier 100A is positioned at the front in the moving direction of the nozzle 100 and thus protects the discharge unit 100B from the foreign substance 80 by removing the foreign substance 80 before the discharge unit 100b reaches the foreign substance 80.

Figure 1:
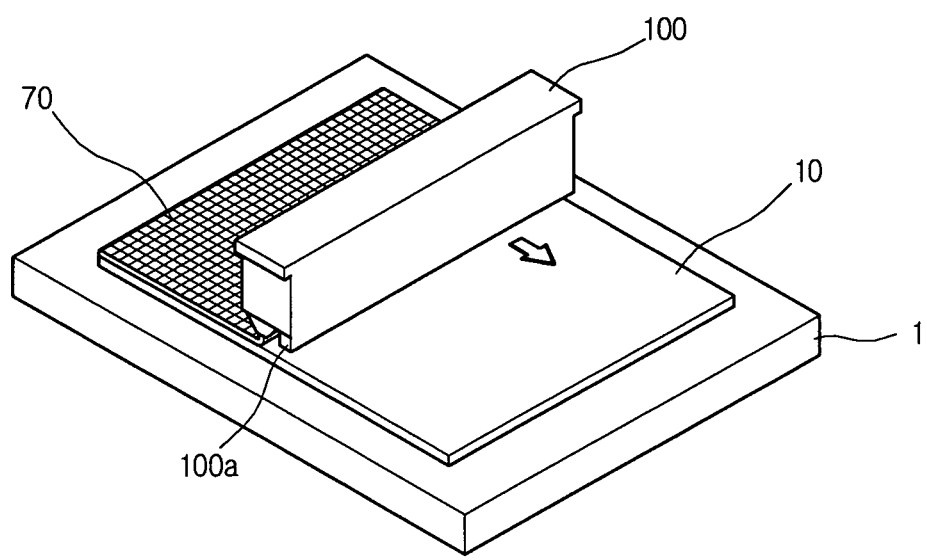
FIG. 1 is a perspective view of a photoresist coating apparatus according to a first embodiment.
Figure 2:
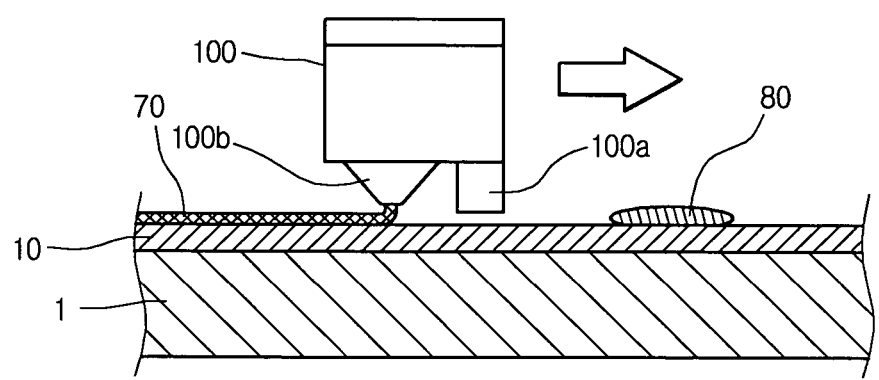
FIG. 2 is a sectional view of the photoresist coating apparatus shown in FIG. 1.
Figure 3:
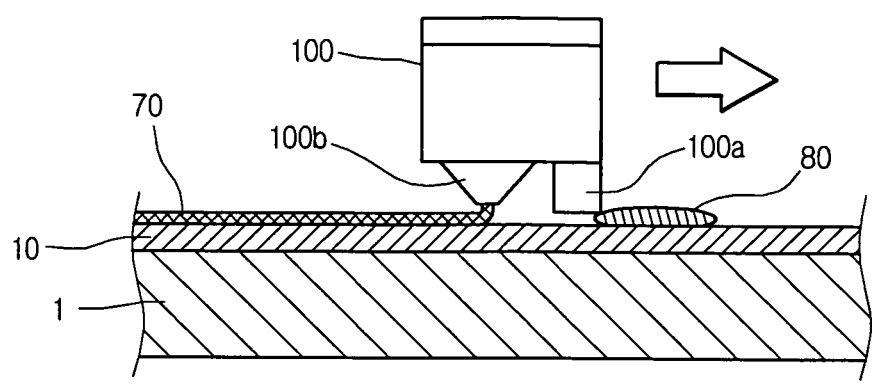
FIG. 3 is another sectional view of the photoresist coating apparatus shown in FIG. 1.
Figure 4:
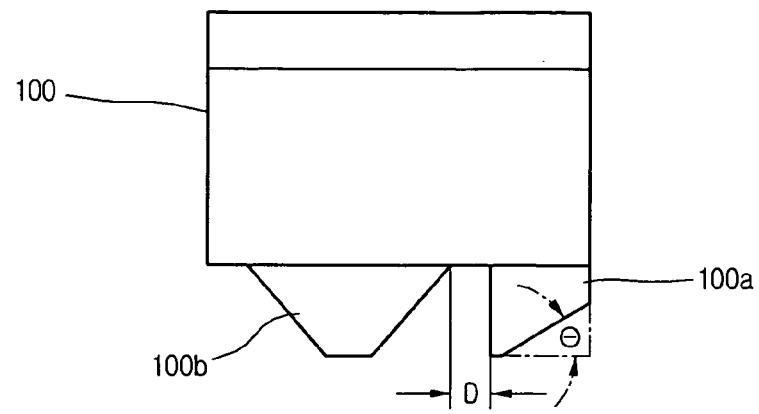
FIG. 4 is a sectional view of a nozzle of a photoresist coating apparatus according to a second embodiment.

As shown in FIG. 4 a distance "d" may be 10 to 300 μm. Although not shown in the drawings, in an alternative, the substrate 10 may be alternatively slid with respect to the nozzle with the nozzle being fixed.

Referring to FIG. 4, an end portion of the foreign substance barrier 100A in a second embodiment may be inclined by a predetermined angle "θ" with respect to a horizontal direction.

The foreign substance barrier 100A first determines whether or not a foreign substance 80 exists on the substrate 10 and then protects the discharge unit 100B by removing the foreign substance 80.

Accordingly, the end portion of the foreign substance barrier 100A is inclined by a predetermined angle "θ" between 1° to 85° to remove the foreign substance 80 while moving in the scanning direction.

The discharge unit 100B discharges a photoresist substantially vertically with respect to the substrate 10 and foreign substance barrier 100A is inclined by an acute angle "θ" smaller than 85° from the upper surface of the substrate 10.

A distance "D" between the discharge unit 100B and the foreign substance barrier 100A and the angel "θ" between the upper surface of the substrate and the end portion of the foreign substance barrier 100A may be adjusted according the manufacturing requirements.

FIG. 5 is a perspective view of a photoresist coating apparatus according to a third embodiment, and FIG. 6 is a sectional view of the photoresist coating apparatus shown in FIG. 5.

Referring to FIGS. 5 and 6, the inventive photoresist coating apparatus includes a nozzle 100 for coating a photoresist on a substrate 10, a discharge unit 100B formed integrally with a lower portion of the nozzle 100, and a foreign substance barrier 100A formed at a front lower portion of the nozzle 100. Further, a light emitting unit 1100 is disposed at a lower portion of the foreign substance barrier 100A in such a way to diagonally irradiate light from the lower portion of the foreign substance barrier 100A toward an upper surface of the substrate 10.

A light receiving unit 1200 is disposed on an upper surface of the nozzle 100 so as to receive light that is irradiated from the light emitting unit 1100 and then reflected from the upper surface of the substrate 10.

Also provided is a determining unit 600 for determining whether or not a foreign substance 80 exists on the substrate 10 by measuring the strength of light sensed by the light receiving unit 1200.

Further provided is a controller 500, a photoresist supplying unit 300 for supplying a photoresist to the nozzle 100 on the basis of the determination results from the determining unit 600, and a transfer driving unit 400 for moving the nozzle 100 under the control of the controller 500.

The nozzle 100 is configured to be arranged across the substrate 10.

The nozzle 100 has a length equal to or larger than the width of the substrate 10. Also, the nozzle 100 discharges a photoresist supplied from the photoresist supplying unit 300 while moving from one end portion of the substrate 10 to the other end portion.

The substrate 10 is a substrate for a LCD, which is to be coated by the photoresist coating apparatus, and may be a transparent insulation substrate such as a glass.

The light receiving unit 1200 is positioned further forward than the discharge unit 100B.

The nozzle 100 including the light emitting unit 1100 and the light receiving unit 1200 is positioned across the upper surface of the substrate 10, and is preferably equal to or larger than the width of the substrate 10.

Also, the nozzle 100 moves from one end of the substrate 10 to the other end portion, the light emitting unit 1100 and the light receiving unit 1200 are positioned at the front in the moving direction of the nozzle 100 and moves together with the nozzle 100.

Thus, light diagonally irradiated from the light emitting unit 1100 toward the upper surface of the substrate 10 is reflected from the upper surface of the substrate 10 and then received at the light receiving unit 1200.

The light emitting unit 1100 and the light receiving unit 1200 may be a general light transmitting/receiving module.

For example, the light emitting unit 1100 has a light emitting element for emitting light according to an applied electrical signal, and the light emitting unit 1200 has a light receiving element for receiving light emitted from the light emitting element. The light emitting unit 1100 may use a laser.

When a substrate 10 does not has a foreign substance 80, light irradiated from the light emitting unit 1100 is received at the light receiving unit 1200 without being affected by the foreign substance 80, and the strength of the received light is set as a reference value by the determining unit 600.

However, when a surface 10 has a foreign substance 80, the strength of light received at the light receiving unit 1200 becomes different from the reference value. The determining unit 600 senses the difference in the light strength and transmits the same to the controller 500.

The determining unit 600 determines whether or not the surface 10 contains the foreign substance 80 by measuring the strength of light received at the light receiving unit 1200, and the controller 500 controls the photoresist supplying unit 300 and the transfer driving unit 400 according to a foreign substance detection/non-detection signal from the determining unit 600.

When the foreign substance detection signal is generated from the determining unit 600, the controller 500 controls the photoresist supplying unit 300 to stop supplying a photoresist material to the nozzle 100.

Also, the controller 500 stops the movement of the nozzle 100 by transmitting the foreign substance detection signal to the transfer driving unit 400.

That is, the photoresist supplying unit 300 supplies the photoresist material to the nozzle 100 when the foreign substance non-detection signal (that is, a signal indicating that a foreign substance does not exist on the substrate 10) is transmitted thereto from the controller 500, and does not supply the photoresist material to the nozzle 100 when the foreign substance detection signal is transmitted thereto from the controller 500.

Accordingly, the photoresist 70 is formed on the substrate 10 while the nozzle 100 moves, and the photoresist 70 is not formed on the substrate 10 while the nozzle 100 does not move.

Also, the transfer driving unit 400 moves the nozzle 100 when the foreign substance non-detection signal is transmitted thereto from the controller 500, and does not move the nozzle 100 when the foreign substance detection signal is transmitted thereto from the controller 500.

In more detail, when the nozzle 100 is moved to coat a photoresist material on the substrate 10 mounted on the stage 1, the light emitting unit 1100 positioned at the lower portion of the foreign substance barrier 100A diagonally irradiates light toward the substrate 10.

The irradiated light is reflected by the substrate 10 or the foreign substance 80 and then received at the light receiving unit 1200, whereby the presence or absence of a foreign substance 80 on and/or beneath the substrate 10 is determined.

The determining unit 600 determines whether or not the foreign substance exists on the substrate 10 by detecting the strength of light received at the light receiving unit 1200, and the controller 500 controls the photoresist supplying unit 300 and the transfer driving unit 400 according to a foreign substance detection/non-detection signal from the determining unit 600.

When the foreign substance detection signal is generated from the determining unit 600, the controller 500 controls the photoresist supplying unit 300 to stop supplying a photoresist material to the nozzle 100.

Also, the controller 500 stops the movement of the nozzle 100 by transmitting the foreign substance detection signal to the transfer driving unit 400.

Accordingly, the discharge unit 100B can be prevented from being brought into contact with the foreign substance or the substrate 10, whereby the discharge unit 100B and the substrate 10 can be prevented from being damaged.

The photoresist coating apparatus and method has advantages such as protecting the nozzle, removing a foreign substance which may be present on the substrate, thus improving productivity. Formation of the nozzle and the discharge unit integrally simplifies the manufacturing process thereof.

Third, the foreign substance barrier is formed in a body with the nozzle, whereby a manufacturing process for them can be simplified.

Although only a few exemplary embodiments of this invention have been described in detail above, those skilled in the art will readily appreciate that many modifications are possible in the exemplary embodiments without materially departing from the novel teachings and advantages of the invention. Accordingly, all such modifications are intended to be included within the scope of this invention as defined in the following claims.

What is claimed is:

1. A method for coating a photoresist on a substrate, the method comprising:
   dispensing a photoresist on the substrate at a discharge unit of a nozzle while the nozzle is moved from one end portion of the substrate to the other end portion thereof;
   while moving the nozzle to dispense photoresist, diagonally radiating a first light from a light emitting unit disposed at a lower portion of a foreign substance barrier toward the substrate, the first light being reflected by the substrate and received by a light receiving unit without being affected by a foreign substance;
   determining a reference strength of a reflected portion of the first light received by the light receiving unit;

diagonally radiating a second light from the light emitting unit toward the substrate, the second light being reflected by the substrate and received by the light receiving unit;

determining whether the foreign substance exists on the substrate based on a comparison between the reference strength of the reflected portion of the first light and a strength of a reflected portion of the second light, wherein the foreign substance barrier is inclined by 1° to 85° from an upper surface of the substrate, wherein an interval between the discharge unit and the foreign substance barrier is 10 to 300 μm, and wherein the foreign substance barrier is disposed on a bottom surface of the nozzle.

2. The method according to claim 1, further comprising the steps of:

controlling the movement of the nozzle and the supply of the photoresist on the substrate depending on whether the foreign substance exists on the substrate.

3. The method according to claim 2, wherein the movement of the nozzle and the supply of the photoresist on the substrate are stopped when the foreign substance exists on the substrate.

4. The method of claim 1, wherein the light is radiated from the light emitting unit by affixing a laser to the nozzle.

5. The method of claim 4, wherein the radiated light is diagonally reflected by the substrate or foreign substance.

6. The method of claim 1, wherein the light receiving unit is disposed on a top surface of the nozzle opposite to the bottom surface of the nozzle and protrudes beyond the light emitting unit in a direction of moving.

7. The method of claim 1, wherein the interval between the discharge unit and the foreign substance barrier is adjustable according to manufacturing requirements.

8. The method of claim 1, wherein the light receiving unit is in the form of a plate extending forwardly from the light emitting unit.

9. The method of claim 1, wherein the light receiving unit is parallel to the substrate.

* * * * *